United States Patent [19]

Effelsberg

[11] Patent Number: 5,430,321

[45] Date of Patent: Jul. 4, 1995

[54] PHOTODIODE STRUCTURE

[75] Inventor: Uwe Effelsberg, Waldbronn, Germany

[73] Assignee: Hewlett-Packard Company, Palo Alto, Calif.

[21] Appl. No.: 238,631

[22] Filed: May 5, 1994

[30] Foreign Application Priority Data

May 19, 1993 [EP] European Pat. Off. ........... 93108156

[51] Int. Cl.$^6$ .................. H01L 27/14; H01L 21/205; H01L 27/146
[52] U.S. Cl. .................................. 257/463; 257/464; 257/446
[58] Field of Search ............... 257/435, 443, 463, 464, 257/446, 461

[56] References Cited

U.S. PATENT DOCUMENTS

4,107,722  8/1978  Chamberlain ........................ 357/30

FOREIGN PATENT DOCUMENTS

| 000012181 | 6/1980 | European Pat. Off. ............ 257/463 |
|---|---|---|
| 0296371A1 | 12/1988 | European Pat. Off. . |
| 2512327 | 9/1975 | Germany . |
| 4116694A1 | 12/1991 | Germany . |
| 4-91473 | 3/1992 | Japan .................................. 257/435 |

OTHER PUBLICATIONS

Sensors And Actuators Jul. 1985, pp. 177-187 "Silicon Optical Sensors Fabricated Through Masked Ion Implantation".
Solid-State Electronics Jan. 1987 No. 1 pp. 89–92 "Stable, High Quantum Efficiency, UV-Enhanced Silicon Photodiodes By Arsenic Diffusion".
Patent Abstracts of Japan vol. 012, No. 342 (E-658) 14 Sep. 1988 & JP-A-63 102 380 (Fujitsu LTD) 7 May 1988 *abstract*.
Patent Abstracts of Japan vol. 004, No. 032 (E-002) 19 Mar. 1980 & JP A-55 003 633 (Sharp Corp) 11 Jan. 1980 *abstracts*.

*Primary Examiner*—Jerome Jackson
*Assistant Examiner*—Donald L. Monin, Jr.

[57] ABSTRACT

A photodiode structure for the detection of radiation comprises a semiconductor base layer of p-type conductivity with a high doping density, an epitaxial layer of p-type conductivity with a relatively low doping density, areas of n-type conductivity and oxide layers covering the areas of n-type conductivity. The oxide layers comprise doping impurities of the same conductivity type as the areas below them. The doping density in the areas of n-type conductivity decrease towards the junction with the epitaxial layer. Due to this decrease in doping density, an electric field gradient is produced which guides the charge carriers to the junction. The generation of a field gradient and the creation of a surface charge result in an improved quantum efficiency. The invention is preferably used in photodiode arrays. Due to the gradient in doping density in the epitaxial layer, charge carriers are reflected at the interface between the layers and so that cross talk between adjacent diodes in a photodiode array is reduced. According to a preferred method for manufacturing a photodiode structure of the invention, the doping of the photodiode structures is performed by ion implantation.

8 Claims, 4 Drawing Sheets

PHOTODIODE STRUCTURE

The invention relates to a photodiode structure for the detection of radiation and a method for manufacturing such a structure. Such a photodiode structures are used, for example, in sensors and detection instruments. Several photodiode structures can be arranged in a line on a semiconductor chip, forming a photodiode array. Photodiode arrays are typically used in spectrophotometers.

BACKGROUND OF THE INVENTION

A photodiode structure of the mentioned type is known from U.S. Pat. No. 4,107,722. This known photodiode structure comprises a silicon substrate of p-type conductivity, a first layer of n-type conductivity having a relatively low doping density which is arranged on the substrate, a second layer of n-type conductivity arranged on the first layer and having a higher doping density than the first layer, and a layer of silicon dioxide arranged on the second layer. The photodiode structure is used for image detectors and scanners and is characterized by an enhanced blue color light response.

Conventional photodiode structures are prone to some deficiencies which will subsequently be explained with reference to FIG. 1. FIG. 1 illustrates the general principle of photo conductive detection with silicon diodes. The photodiode comprises an insulating layer 8, a first semiconductor layer 3 of a first conductivity type and a second semiconductor layer 4 of a second conductivity type. The photons 5 are absorbed in the silicon generating a charge pair 6. In impurity doped devices, only the minority carriers in the given layer need to be considered for the model. The generated charge is detected (via connectors 1a and 1b) as the minority carrier is able to diffuse to and cross the junction of the diode. A competitive process is the recombination of the minority carrier at defect centers 7. This process reduces the quantum efficiency. The defect center concentration is very high at the surface and is usually increasing with high doping and bad lattice match of the dopant.

The absorption is very low in the infrared spectral region. The minority carriers are generated deeply in the silicon. The diffusion length to the junction is long and the limited lifetime due to active defect centers reduces the quantum efficiency. In photodiode arrays, a long lifetime and diffusion length leads to cross talk between adjacent diodes.

In contrast to the infrared spectral region, the absorption in the ultraviolet (UV) region is very high. The minority carriers are generated very close to the surface of the device. The high photon energy generates defects and traps near or at the surface of the silicon. The quantum efficiency is reduced on the long run. This problem is known as photodegradation. Upon a sudden exposure to light, the generated traps are slowly filled with charge. Therefore, the electrical field near the surface changes with exposure. This results in changing quantum efficiency. The consequence is a drifting detector signal, also referred to as "transients".

SUMMARY OF THE INVENTION

It is thus an object of the invention to provide a photodiode structure which has an increased quantum efficiency over a broad spectral range from vacuum ultraviolet to the infrared.

It is a further object of the invention to provide a photodiode structure the quantum efficiency of which does not change, especially degrade, over time.

According to a still further object, a photodiode structure is to be provided wherein the response to large signal changes is not drift superimposed.

It is an additional object of the invention to provide a method of manufacturing a photodiode structure avoiding the above mentioned deficiencies which is compatible with integrated circuit manufacturing processes without requiring additional special processing steps.

In accordance with the present invention, these objects are achieved by a photodiode structure as defined in claim 1 and by a manufacturing method as defined in claim 10. According to claim 1, the photodiode structure comprises a top layer of a semiconductor oxide, a highly doped semiconductor layer of n-type conductivity, a semiconductor layer of p-type conductivity, and a highly doped base layer of p-type conductivity. The oxide layer comprises doping impurities of the same doping type as the highly doped layer below the oxide layer. In that way, a high concentration gradient can be generated and maintained during following diffusion steps. Due to the decreasing doping density in the layer underneath the oxide layer, an electric field gradient is produced which guides the minority carriers to the junction where they are collected. The doped oxide tends to accumulate a high positive interface charge. Both measures, i.e., creation of surface charge and electric field gradient, act together for ensuring an efficient collection of the minority carriers and thus lead to an improved quantum efficiency.

Preferably, a doping concentration of the semiconductor material is selected which is substantially higher than in prior art photodiodes. A high doping concentration leads to an increased absorption coefficient. Due to the increased absorption coefficient, more charge pairs are generated and can be detected whereby the quantum efficiency is further increased. In contrast to the present invention, it was considered in the prior art to be unfavorable to use high doping concentrations because of the associated defect center concentration. In accordance with the present invention, the negative effect of the defect center generation can be compensated by field guided diffusion, shorter distance to the junction and higher absorption.

In contrast to the present invention, it was taken care in the prior art that the surface oxide was very clean with low impurity concentration and low surface charge. However, with a high surface charge repulsing the carriers, the quantum efficiency is much less a function of the surface defect density or the trap concentration. A clean oxide is able to withdraw dopant from the silicon, reversing the concentration gradient close to the surface. Growing a doped oxide on the silicon can result in a concentration enrichment at the surface of the silicon. This is particularly useful in the ultraviolet range. In the range 360 to 90 nm, the absorption coefficient is higher than $1 \cdot 10^6$ 1/cm. The enrichment at the silicon surface is therefore most effective in this range.

In summary, a photodiode structure according to the invention ensures a quantum efficiency which is at a high and constant level over the lifetime of the photodiode and over a broad spectral range from $1 \cdot 10^6$ nm to vacuum ultraviolet.

The invention also provides a simple and inexpensive process for manufacturing a photodiode structure having the mentioned advantages of the invention and which is compatible with current integrated circuit manufacturing methods. The doping is performed by ion implantation through an oxide layer, and thereafter the chip is heated, for example in an oven, whereby the concentration of the dopant right at the surface piles up.

The invention is preferably used in a photodiode array. The individual photodiodes constituting the array are manufactured together in one manufacturing process. According to a preferred embodiment, the edges of the individual photodiodes are covered with UV opaque shields, respectively, which prevent UV degradation and leakage currents. The UV opaque shields can be produced in the same manufacturing process wherein the entire array is produced, using known integrated circuit processing steps. A photodiode array of the invention provides for a high quantum efficiency in the whole spectral range from 1100 nm to vacuum ultraviolet. Such a photodiode array provides for improved detection sensitivity in a spectrophotometer, for example in analytical chemistry where very low detection limits are required. A photodiode array of the invention can advantageously be used in a detector for liquid chromatography or for capillary electrophoresis.

In an embodiment of the invention which is particularly useful for a photodiode array, the doping concentration in the doped layer arranged on the semiconductor base layer increases towards this base layer. The result is that an electric field gradient is generated which repels charge carriers and thus prevents charge carriers to move from one photodiode to an adjacent one, i.e., cross talk is reduced.

BRIEF DESCRIPTION OF THE DRAWINGS

Subsequently, embodiments of the invention will be explained in detail with reference to the drawings.

DETAILED DESCRIPTION OF THE INVENTION

Figure 1:
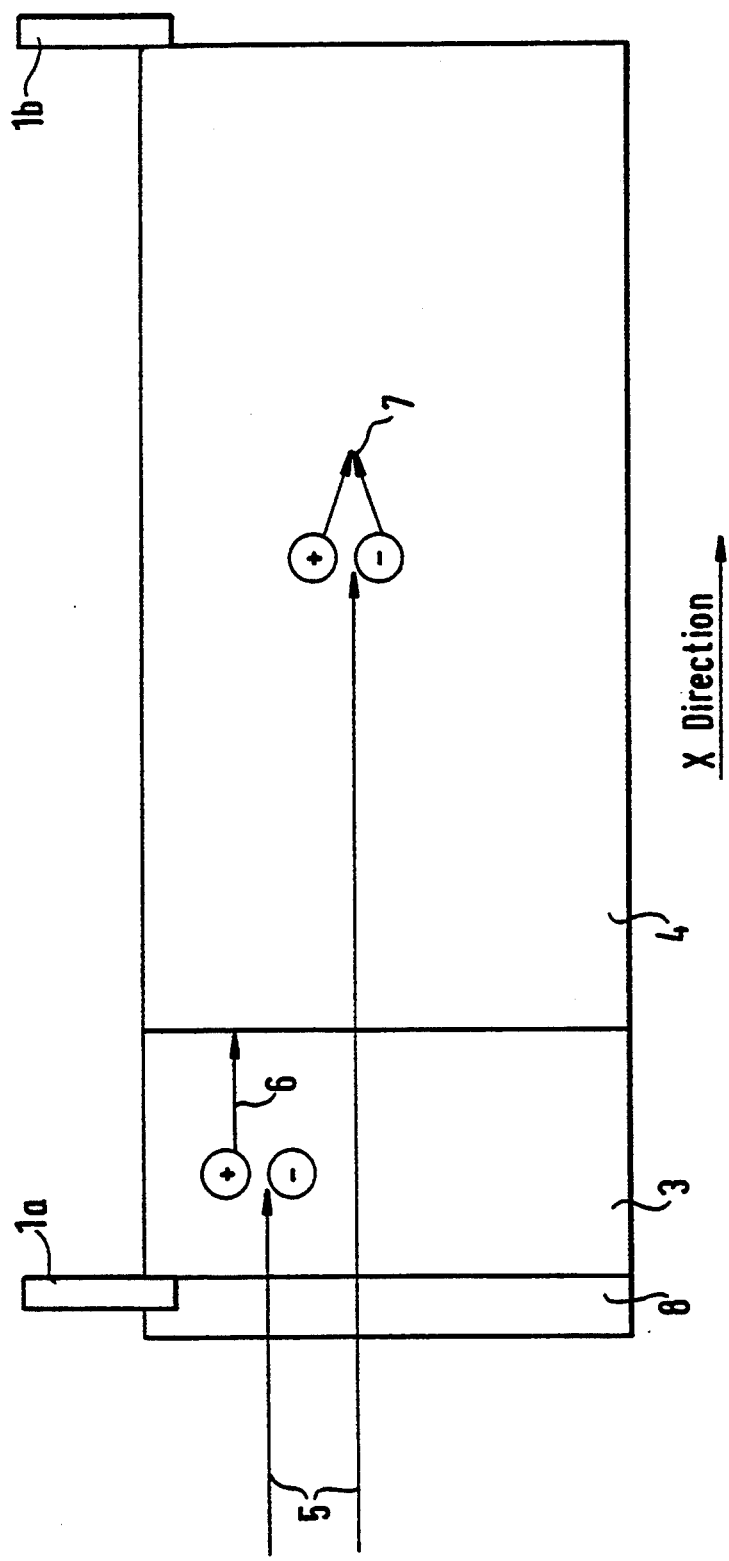
FIG. 1 is a schematic diagram of a photodiode for illustrating the principle of photodetection.
Figure 2:
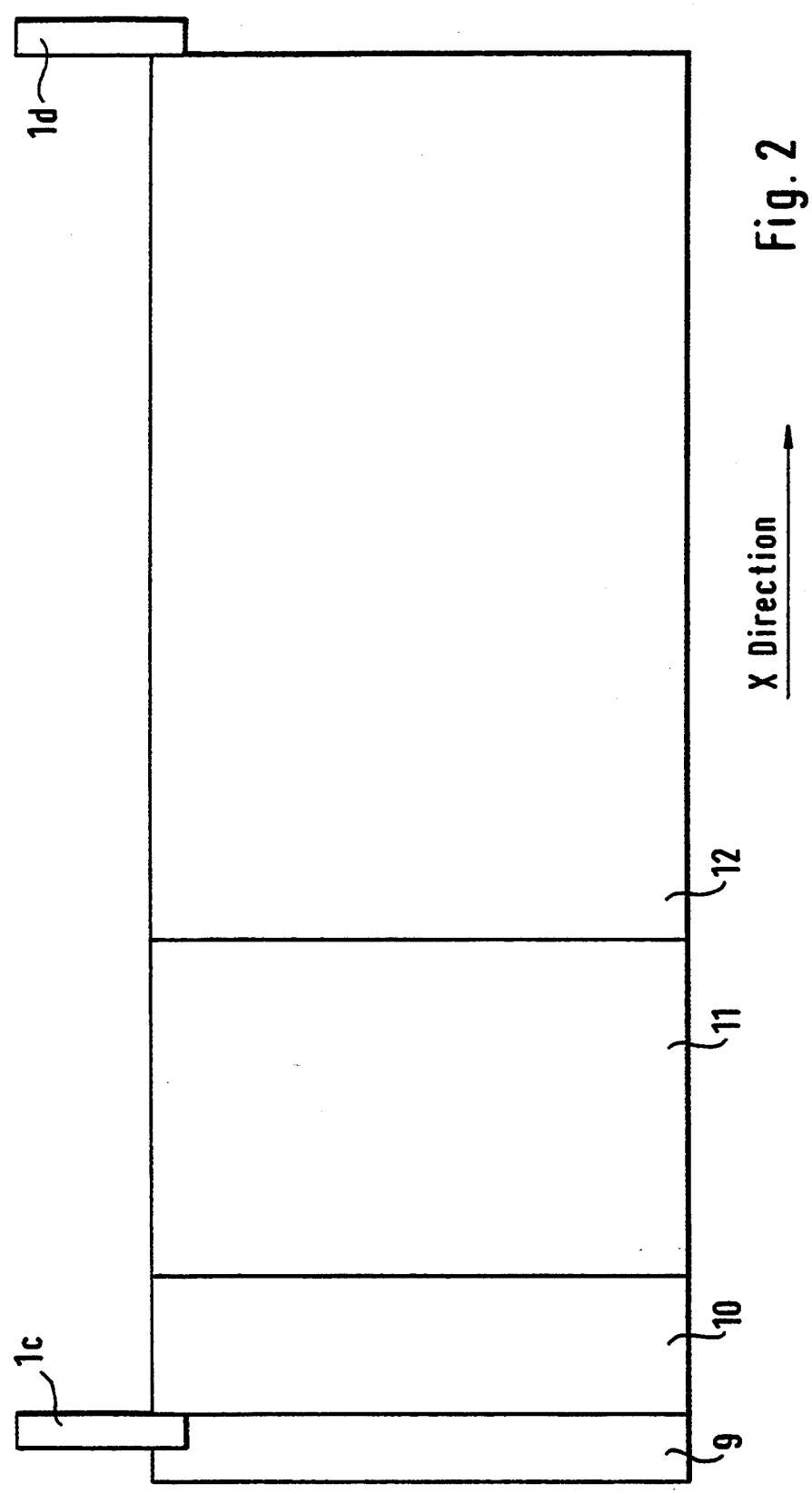
FIG. 2 shows a cross-section through a photodiode structure in accordance with an embodiment of the invention.

FIG. 2 schematically shows a cross-section through a photodiode structure in accordance with a preferred embodiment of the invention. The structure substantially comprises four layers, a p-type silicon substrate 12, a p-type layer 11, an n-type layer 9, and an oxide layer 9. The oxide layer 9 has a high dopant concentration near the silicon, i.e., near the layer 10. The thickness of the oxide layer 9 is in the range of 500 nm. At least the oxide portion close to the silicon surface 10 has been grown by thermal oxidation. The thickness of the thermally grown oxide is about 10 to 20 nm.

The silicon has been doped by ion implantation with phosphorous. The silicon has been doped through an initial oxide which is 75 nm thick. The implantation energy is chosen to put the maximum of the resulting dopant concentration at the oxide/silicon interface. For an oxide thickness of 75 nm, the implantation energy for phosphorous is 75 keV. The oxide allows an implantation energy compatible to normal integrated circuit fabrication processes and still keeps the highest concentration close to the silicon surface. With higher implantation energies, the maximum of the dopant distribution is wider, making it easier to place the dopant maximum onto the silicon surface.

Figure 3:
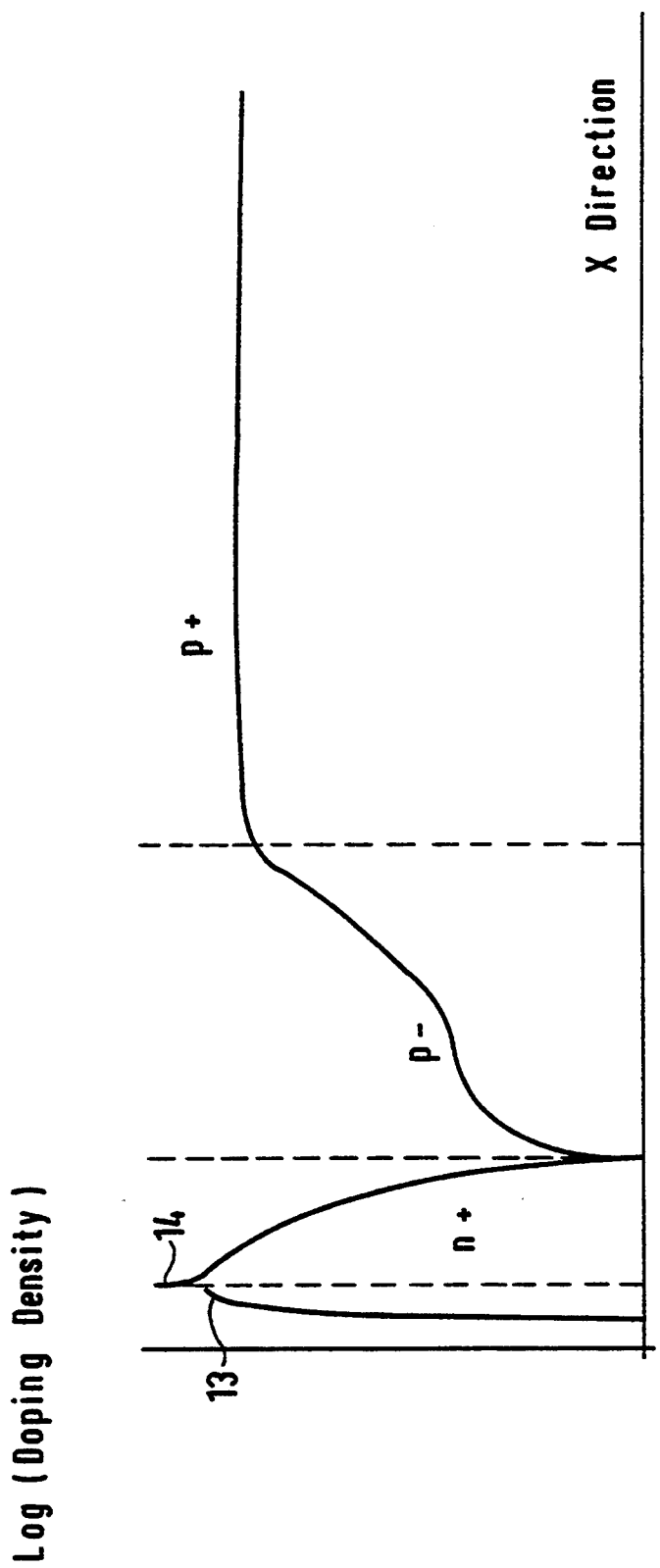
FIG. 3 is a graphical representation of the doping density of the photodiode structure shown in FIG. 2.

FIG. 3 is an illustration of the doping density of the photodiode structure shown in FIG. 2. The thermal oxidation after the implantation piles up the concentration of the dopant right at the surface 14. This compensates for process tolerances in doping depth and oxide thickness. The thermal oxidation is preferably performed by putting the entire semiconductor chip into an oven for a specified time. The resulting peak concentration in the silicon is about $1 \cdot 10^{20}$ $1/cm^3$. The concentration in the oxide is a factor of 10 lower. This requires the oxidation in an oven to be of comparable speed relative to the dopant diffusion in the silicon. With a fast oxidation, the equilibrium would not be reached and with a long final diffusion the pile up at the silicon surface would vanish. The final device has a typical junction depth of 450 nm.

The impurity concentration profile in the layer 10 generates an electrical field which is proportional to $1/N \cdot (dN/dX)$, wherein N is the impurity concentration (or doping density) and X is the coordinate describing the distance from the surface of the photodiode. The impurity profile monotonously decreases towards the junction so that the electrical field will guide the minority carriers to the junction. A high concentration gradient and a short distance to the junction are preferred for ensuring an efficient collection of the charge carriers.

A p-layer 11 is underneath the junction. It is an epitaxial layer of several micro-meter thickness grown on highly p+ doped silicon. The base impurity concentration of boron is about $1 \cdot 10^{15}$ $1/cm^3$. The highly doped layer 12 with a concentration of about $1 \cdot 10^{19}$ $1/cm^3$ boron has a higher absorption coefficient for long wavelength photons. The additional concentration gradient guides minority carriers back towards the junction. In photodiode arrays, the potential barrier of the p− p+ interface reduces the signal cross talk between adjacent diodes.

Figure 4:
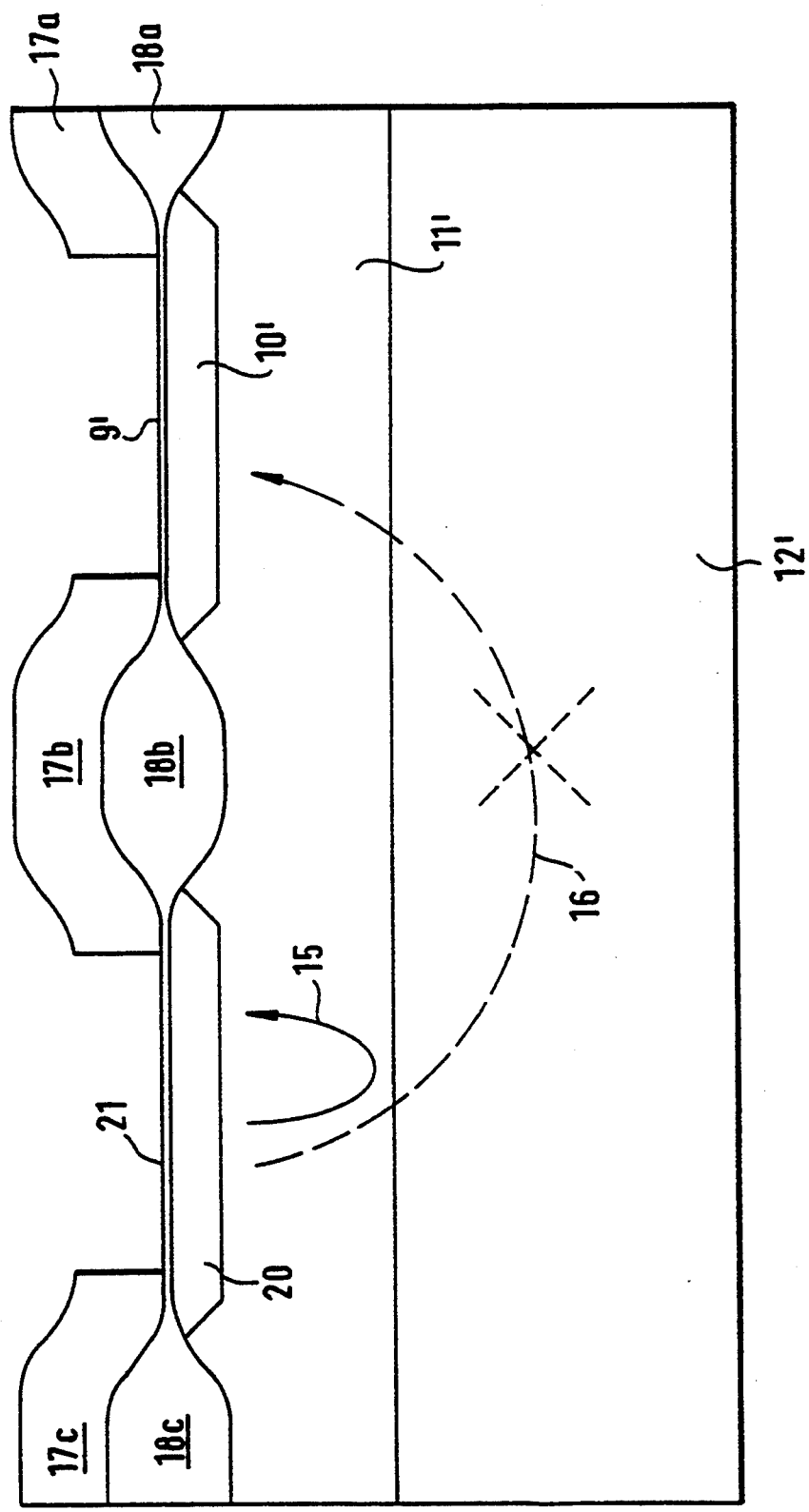
FIG. 4 is a cross section through a part of a photodiode array in accordance with the invention.

FIG. 4 illustrates a further embodiment of the invention wherein the photodiode structures of the invention are arranged in a photodiode array. FIG. 4 is a cross section through two of the photosensitive areas of a photodiode array which typically comprises several tens or even hundreds of such photosensitive areas. The photodiode array has a base layer 12', which is substantially the same as the layer 12 shown in FIG. 2, i.e., a p+ silicon substrate. On top of the layer 12' is an epitaxial layer 11' corresponding to the layer 11 in FIG. 2. The doping profile in the layer 11' corresponds to the profile shown in FIG. 3. The regions 10' and 20 constitute the individual photosensitive areas. The doping profile in these regions corresponds to the profile 14 shown in FIG. 3. On top of the regions 10' and 20 are oxide layers 9' and 21, respectively, which correspond to the oxide layer 9 according to FIG. 2. The doping density profile in the layers 9' and 21 corresponds to that shown in FIG. 3 with reference numeral 13. The photodiode array shown in FIG. 4 also comprises regions 18a, 18b, 18c of field oxide which provide an isolation between the photosensitive areas. The photodiode array comprises metal layers 17a, 17b, 17c which cover the edges of the photosensitive areas 10' and 20. The main purpose of these metal layers is to shield the edges of the photosensitive areas from UV radiation which would cause unwanted leakage currents. As an alternative to the metal layers 17a–c, a layer of polysilicon could also be used for shielding the edges of the regions 10' and 20 from UV radiation. In both alternatives, the shielding layer can be applied by state of the art IC production processes.

The process for manufacturing a photodiode array according to the invention is compatible with state of the art IC production. In such a photodiode array, photosensitive regions and circuitry technology are combined in a chip and are manufactured by suitable IC processing steps. A photodiode array is typically used in spectrophotometry for detecting the light which has been spatially separated by a wavelength-dispersive element such as a diffraction grating. The different diodes are exposed to different wavelengths. Consequently, each diode of the array should have a high, stable quantum efficiency in the whole spectral range of interest. The performance cannot be optimized to just a part of the range. As mentioned above, the repelling characteristic of the p− p+structure helps to reduce cross talk from diode to diode. Reference numeral 15 depicts a possible diffusion path for a charge carrier. As can be seen, the charge carrier is reflected before it can reach the boundary between the layers 11 and 12. The hypothetical path 16 shown in dashed lines is not possible because of the mentioned repulsion due to the electric field gradient. Since such a path is not possible, cross talk between adjacent diodes is substantially reduced. In photodiode arrays, one contact (such as contact 1c shown in FIG. 2) is connected to ground. The other contact (such as contact 1d shown in FIG. 2) is connected via a FET switch to a readout line and eventually to an additional storage capacitor. During readout, a reference voltage is applied to the diode. In the integration period, the voltage at source/drain of the connecting FET switch is varying between the reference voltage and 0 V. This changes the threshold voltage of the FET, too. This undesired effect is reduced by an impurity profile similar to the one described above. Prior art profiles, such as the profile described in U.S. 4,107,722 has a much higher back bias effect due to the larger depletion region.

It is understood that several alternatives to the just described specific embodiments of the invention are possible. For example, certain of the described process steps could be varied. If it is desired for reasons of compatibility with existing processing methods, the oxide present during ion implantation can be removed and regrown in a thermal oxidation step. However, it is necessary to anneal and/or regrow oxide on the silicon to get a pile up of impurity concentration at the surface.

The impurity atoms phosphorous, arsenic and antimony can be used for doping, because all three have a segregation coefficient in favor of silicon versus oxide. But implantation energy and oxide thickness have to be chosen different for the dopants to get the same impurity profile.

While working with higher reversed bias, leakage might become a significant noise source at low light levels. This can be circumvented by higher diffusion or with a second or third implant with higher energy and lower dose. The junction is enlarged, reducing the field strength. However, the junction should be kept close to the surface, where the charge pair generation is highest for all wavelengths and the diffusion length short.

I claim:

1. A photodiode structure for the detection of radiation, comprising:
   a semiconductor base layer of a p-type conductivity having a relatively high doping density,
   a first layer of material arranged on said base layer, having a p-type conductivity and a doping density which is generally smaller than that of said semiconductor base layer,
   a second layer of material arranged on said first layer, having an n-type conductivity, wherein the doping density in the second layer decreases towards a junction with the first layer, and
   an oxide layer arranged on said second layer, said oxide layer comprising dopant impurities of the same conductivity type as the second layer and wherein a doing density of said dopant impurities in the oxide layer and said doping density in the second layer exhibit a discontinuity at a boundary between said oxide layer and said second layer.

2. A photodiode structure as in claim 1, wherein the segregation coefficients, which is an equilibrium concentration of dopant impurities in the second layer divided by an equilibrium concentration of dopant impurities in the oxide layer is greater than one, and a dopant diffusion in the oxide layer is small compared to that in the second layer.

3. A photodiode structure as in claim 1 wherein the first layer is an epitaxial layer.

4. A photodiode structure as in claim 1 wherein the doping density in the second layer increases from the junction between the first layer and the second layer towards the semiconductor base layer.

5. A photodiode structure as in claim 1 wherein impurity atoms in the second layer and in the oxide layer are selected from the group consisting of: phosphorous, arsenic, and antimony.

6. A photodiode array comprising a plurality of photodiode structures recited in claim 1.

7. A photodiode array as in claim 6, wherein the base layer and the first layer form a common layer to all individual photodiode structures.

8. A photodiode array as in claim 6, wherein edges of the second layer of the photodiode structures are covered by UV opaque layers, respectively.

* * * * *